United States Patent [19]

Nuyen

[11] Patent Number: 5,528,051
[45] Date of Patent: Jun. 18, 1996

[54] QUANTUM WELL INFRARED DETECTOR

[75] Inventor: Linh T. Nuyen, Paris, France

[73] Assignee: Picogiga Societe Anonyme, Les Ulis, France

[21] Appl. No.: 256,760

[22] PCT Filed: Jan. 21, 1993

[86] PCT No.: PCT/FR93/00060

§ 371 Date: Jul. 22, 1994

§ 102(e) Date: Jul. 22, 1994

[87] PCT Pub. No.: WO93/15525

PCT Pub. Date: Aug. 5, 1993

[30] Foreign Application Priority Data

Jan. 22, 1992 [FR] France .................... 92 00667

[51] Int. Cl.$^6$ ................. H01L 29/06; H01L 31/0328
[52] U.S. Cl. ................. 257/17; 257/21; 257/25; 257/184
[58] Field of Search ................. 257/23, 17, 21, 257/25, 22, 184, 189; 250/214.1

[56] References Cited

FOREIGN PATENT DOCUMENTS 0299841  1/1989  European Pat. Off. ............. 257/21

OTHER PUBLICATIONS

Choi et al., "Multiple quantum well 10 μm GaAs/AlGaAs infaraed detector with improved responsivity", Appl. Phys. Lett. 50 (25), Jun. 1987.
Applied Physics Letters, vol. 59, No. 15, 7 Oct. 1991, pp. 1864–1866, "Normal incidence hole intersubband absorption long wavelength . . . ", by B. F. Levine et al.
Applied Physics Letters, vol. 9, 26 Feb. 1990, pp. 851–853, "High sensitivity low dark current 10 μm GaAs quantum well infrared photodetectors", by B. F. Levine et al.
Applied Physics Letters, vol. 50, No. 16, 20 Apr. 1987, pp. 1092–1094, "New 10 μm infrared detector using intersubband absorption in resonant tunneling . . . ", By B. F. Levine et al.
Journal of Applied Physics, vol. 64, No. 3, 1 Aug. 1988, pp. 1591–1593, "Bound–to–extended state absorption GaAs superlattice transport infrared detectors", by B. F. Levine et al.
Journal Of Vacuum Science and Technology, Part B, vol. 10, No. 2, Mar. 1992, pp. 995–997, "Gas source molecular-–beam expitaxial growth of normal incidence . . . ", by J. M. Kuo et al.

*Primary Examiner*—Rolf Hille
*Assistant Examiner*—Minhloan Tran
*Attorney, Agent, or Firm*—Jacobson, Price, Holman & Stern

[57] ABSTRACT

The semiconductor component, comprises a succession of alternating stacked layers of a III-V semiconductor material with a large forbidden band such as $Al_xGa_{1-x}As$ and a III-V semiconductor material with a small forbidden band such as GaAs with p-doping, defining a quantum (9) with sub-bands of HH and LH type in the region of the layer comprising the material with a small forbidden band in the valence band diagram ($E_v$) of each corresponding heterostructure. According to the invention, the thickness of the material with a small forbidden band is essentially selected in such a manner that only two quantum sub-levels $LH_1$ and $HH_1$ appear in the well, and the energy difference between these two sub-levels corresponds to the energy of the photons (6) to be detected, and the composition of the material with the large forbidden band is essentially selected in such a manner that the height adjacent the barrier ($\Delta E_v$) of the quantum well is equal to or greater than the energy of the $LH_1$ sub-band.

7 Claims, 3 Drawing Sheets

QUANTUM WELL INFRARED DETECTOR

This invention concerns semiconductor infrared detectors.

These detectors have particularly advantageous applications in the range from 8 μm to 12 μm because these wavelengths correspond to a transparent window in the atmosphere. However, although this is a preferred sensitivity range, the invention is not limited to this particular range of values.

The material used most often for these semiconductor detectors is the alloy HgCdTe but this material is metallurgically extremely complex, which makes its industrial production difficult.

Several laboratories have recently proposed using a new type of infrared detector—of the generic type to which the detector of the invention pertains—based on the principle of absorption of photons associated with transitions between two quantum sub-bands appearing in the quantum wells created by stacking a very large number of alternating epitaxial layers of III-V semiconductor material.

The advantage of these detectors comes mainly from the fact that the use of III-V compounds in place of II-VI compounds such as HgCdTe involves matellurgy that is much more manageable, making it easier to effect industrial production of these detectors.

However, for various reasons which are explained in detail below, the performance of these quantum well detectors with III-V semiconductors has so far been inferior to that of HgCdTe detectors.

One of the objects of the invention is to overcome this limitation, by providing a quantum well detector with III-V semiconductors which has a high detection sensitivity.

To this end, the detector of the invention, which is of the type specified above, i.e. comprising a succession of alternating stacked layers of a III-V semiconductor material with a large forbidden band and a III-V semiconductor material with a small forbidden band with p-doping, defining a quantum well with sub-bands of HH and LH type in the region of the layer comprising the material with a small forbidden band in the valence band diagram of each corresponding heterostructure, is characterized in that the thickness of the material with a small forbidden band is essentially selected in such a manner that only two quantum sub-levels $LH_1$ and $HH_1$ appear in the well, and in that the energy difference between these two sub-levels corresponds to the energy of the photons to be detected, and the composition of the material with the large forbidden band is essentially selected in such a manner that the height of the barrier adjacent the quantum well is equal to or greater than the energy of the $LH_1$ sub-band.

As to the material with a large forbidden band, its thickness is very advantageously so selected that the potential barriers defined by the layers of this material are sufficiently low for the resonant tunnel effect occurring through these barriers of light holes populating the sub-level $LH_1$ to create for these light holes a state in which the wave function thereof is spread in the assembly of the quantum wells and potential barriers, while that of the heavy holes populating the $HH_1$ sub-level is localized.

The material of this structure with a large forbidden band is preferably $Al_xGa_{1-x}As$ and the material with a small forbidden band GaAs. In this case, the thickness of the material with a small forbidden band lies in the range 1.5 nm to 2.5 nm approx., and the thickness of the material with a large forbidden band is about 8 nm approx. In a variant, the material with the small forbidden band can be $In_yGa_{1-y}As$, with an indium content $Y_{In} \leq 0.05$ approx.

The invention is now explained in more detail, with reference to the accompanying drawings. In all of the figures the same reference numerals designate like parts.

Figure 2A:
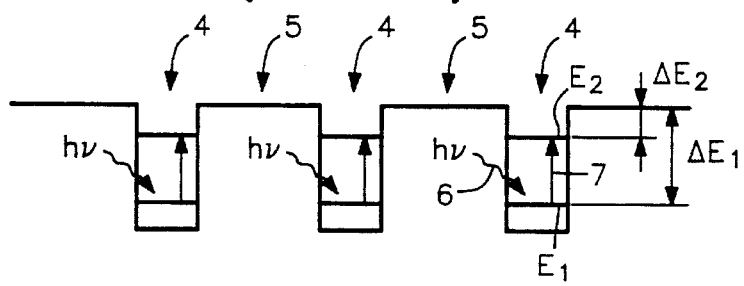
FIGS. 2a and 2b show the behavior of the conduction band of a prior art structure, respectively when quiescent and when biased, but with the thickness of the layers of GaAs reduced in such a manner that the energy difference of the quantum sub-bands corresponds to the wavelength of the light to be detected.
Figure 2B:
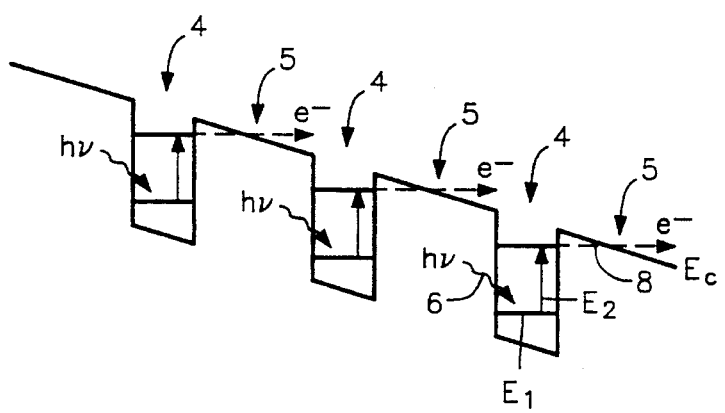
Figure 3A:
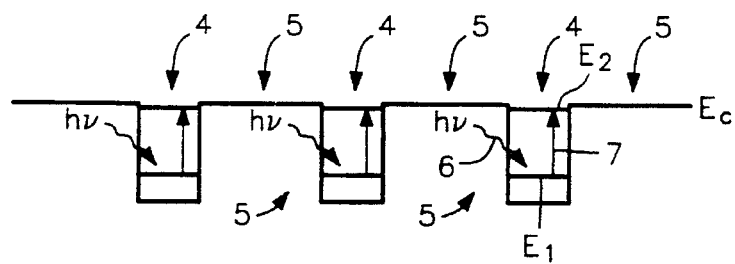
Figure 3B:
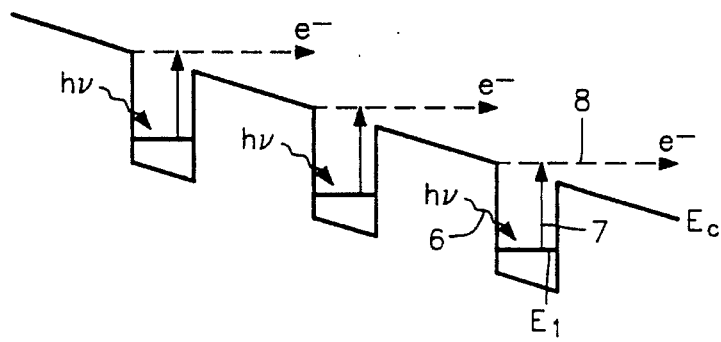

FIGS. 3a and 3b correspond to FIGS. 2a and 2b for the case in which the composition of the AlGaAs layer has been so selected that the higher quantum sub-level comes level with the edge of the quantum well.

Figure 4:
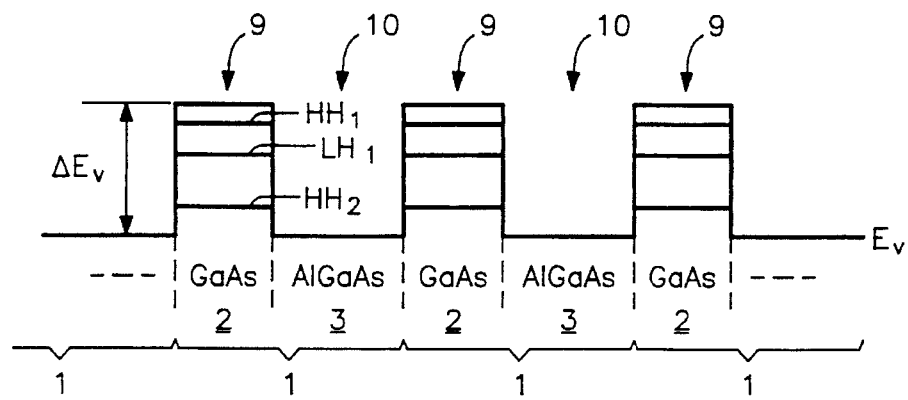

FIG. 4 is a schematic representation of the valence band of a stack of AlGaAs/GaAs layers.

Figure 5A:
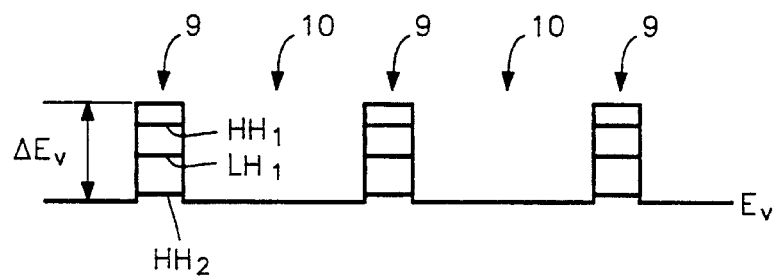
Figure 5B:
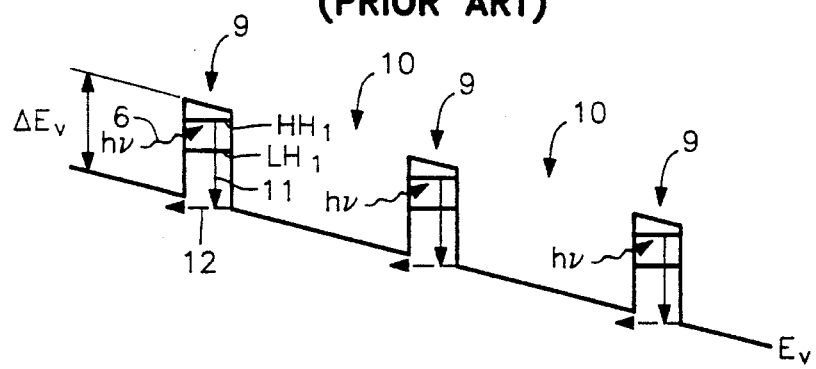

FIGS. 5a and 5b illustrate the behavior of the valence band of a prior art structure such as that of FIG. 4, respectively when quiescent and biased.

Figure 6A:
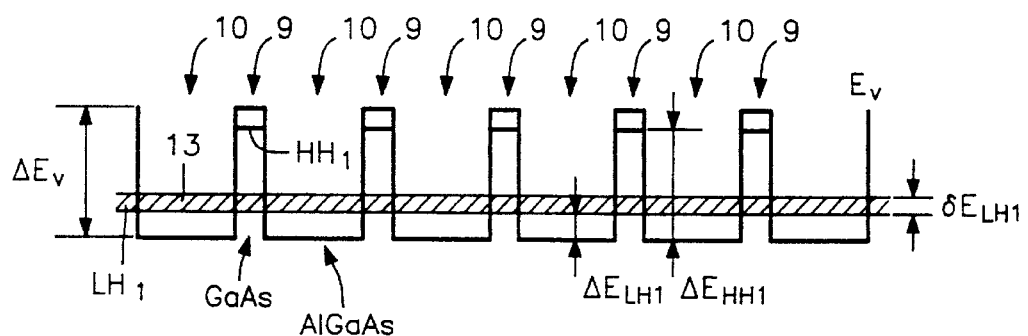
Figure 6B:
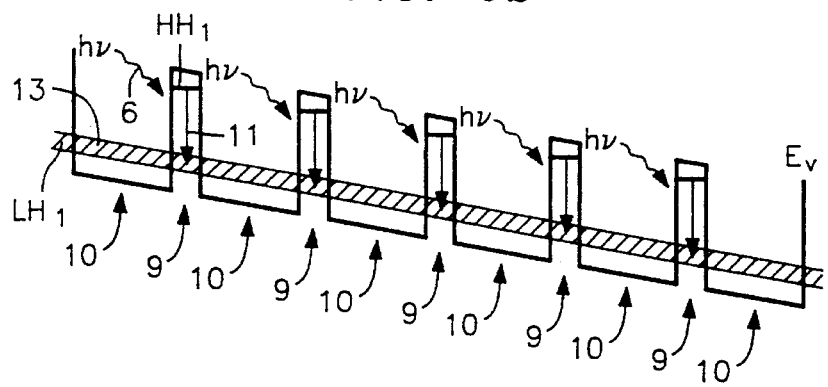

FIGS. 6a and 6b correspond to FIGS. 5a and 5b but for a structure in which the doping and dimensions of the layers have been determined in accordance with the teaching of the invention.

Figure 7A:
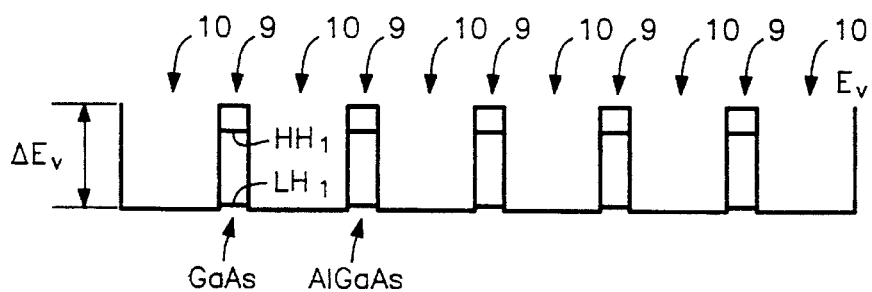
Figure 7B:
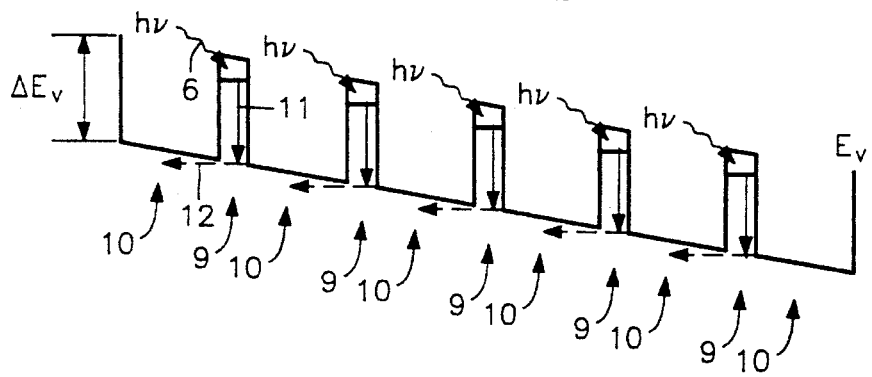

FIGS. 7a and 7b correspond to FIGS. 6a and 6b, for a modified embodiment of the invention.

The current state of quantum well detectors is firstly recalled, especially the mechanism whereby these detectors operate.

Figure 1:
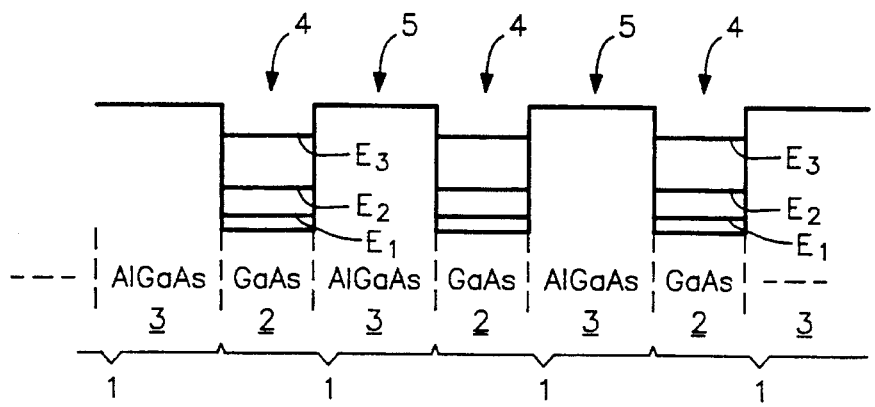
FIG. 1 is a schematic representation of the conduction band of a stack of AlGaAs/GaAs layers.

These detectors are essentially formed by a stack of heterostructures 1, as illustrated in FIG. 1, each formed by a layer 2 of GaAs and a layer 3 of AlGaAs. These different layers are deposited epitaxially one on the other and the complete stack can comprise up to about fifty heterostructures 1. This arrangement of layers creates a corresponding succession of discontinuities, alternately quantum wells 4 and potential barriers 5, in the conduction band $E_c$, shown schematically in FIG. 1.

If the GaAs layers are thin enough, in the order of a few nanometers, quantum sub-bands (quantum levels) $E_1$, $E_2$, $E_3$, etc. appear from the quantum effect. By appropriate selection of the thickness of the GaAs layers, i.e. the width of the quantum wells 4, it is possible to adjust the energy positions of the $E_1$ and $E_2$ sub-bands in such a manner that the difference $\Delta E_1 - \Delta E_2$ between the energies of the quantum levels $E_2$ and $E_1$ will be in the order of 124 meV approx., as illustrated in FIG. 2a. If such a structure is illuminated by light with a wavelength of 10 μm, i.e. by photons with energy h=124 meV, these photons will induce a resonant electronic transition from the sub-band $E_1$ to the sub-band $E_2$, symbolized by the arrow 7. If an electric field is applied to such a structure (FIG. 2b), that is to say if the component is biased, the electrons in the sub-band $E_2$ can pass by the tunnel effect through the potential barriers 5 corresponding to the AlGaAs layers, as symbolized by the arrow 8, thus generating a measurable photo-current.

The first detectors implemented on this principle have been described by B. F. Levine et al., New 10 μm Infrared Detector Using Intersubband Absorption in Resonant Tunneling GaAlAs Superlattices, Appl. Phys. Lett., Vol. 50, No. 16, p. 1092 (1987). Account is taken there of the incidence of a parasitic tunnel current due to electrons in level $E_1$ whose tunneling transparency, although less than that of the electrons in level $E_2$ cannot be neglected. This tunnel current thus creates a high dark current which is detrimental to the performance of the detector.

In this respect, it is known that the tunneling transparency is expressed by an equation of the type:

$$T = A \exp[-(m^{*1/2} \Delta E^{3/2} d)/V],  \quad (1)$$

where:

m* is the mass of an electron,

ΔE is the height of the barrier for the electron in question (ΔE$_1$ for the sub-band E$_1$ and ΔE$_2$ for the sub-band E$_2$), d is the thickness of the potential barrier of AlGaAs, and V is the applied voltage.

It has then been proposed to increase the thickness d of the barrier and/or to increase its height ΔE$_1$. However, doing this also reduces the tunneling transparency of the electrons in the sub-band E$_2$, i.e. those which generate the photo-current. A compromise appears to be difficult to achieve and the quantum well detectors with the best performance currently made are designed in such a manner that the E$_2$ sub-band is located just at the edge of the well, as seen in FIGS. 3a and 3b, It is thus possible to increase the thickness of the potential barrier 5 or in other words reduce the dark current without however affecting the photo-current. Reference may be made in this respect to the work of B. F. Levine et al., *Bound-to-Extended State Absorption GaAs Superlattice Transport Infrared Detectors*, J. Appl. Phys., Vol. 64, No. 3, p. 1591 (1988), which refers to a "detectivity" D*=10$^{10}$ cm. Hz$^{-1/2}$/W at 77 K., a result close to but still less than that obtained with a conventional HgCdTe detector, which yields 3×10$^{10}$ cm. Hz$^{-1/2}$/W at the same temperature.

A first limitation in the performance of this structure is the low lifetime of the electrons in the structure, which is related to the lifetime of electrons in the material (AlGaAs) forming the potential barrier in which the hot electrons move.

A second limitation is similar to the phenomenon of inter-sub-band optical absorption which should obey certain rules of quantum mechanical selection prohibiting light incident perpendicular to the plane of the layers.

Very recently, this second difficulty has been tackled by B. F. Levine et al., *Normal Incidence Hole Intersubband Absorption Long Wavelength GaAs/Al$_x$Ga$_{1-x}$As Quantum Well Infrared Photodetectors*, Appl. Phys. Lett., Vol. 59, No. 15, p. 1864 (1991), which proposes to use quantum wells created by discontinuities in the valence band, not in the conduction band.

Thus, in the latter case, the optical inter-sub-band absorption can be obtained with light incident perpendicular to the plane of the layers. The cited article thus refers to a detection sensitivity of 3.1×10$^{10}$ cm. Hz$^{-1/2}$/W at 77 K. for the wavelength 7.9 μm.

However, this proposal also suffers from limitations, due on this occasion to the low lifetime of the holes.

Thus, if we consider, as is illustrated in FIG. 4, the discontinuities created in the valence band of the structure, which alternates quantum wells 9 with potential barriers 10, it is apparent that in each quantum well 9 there are many sub-bands HH$_1$, HH$_2$, LH$_1$, etc., (the designation HH referring to the heavy holes and LH to the light holes), Three of these sub-bands are illustrated in FIG. 4 but the situation can vary very considerably, depending on the width of the quantum wells 9 or the height ΔE$_v$ of the potential barrier 10.

FIGS. 5a and 5b represent schematically the case described by Levine in the article last cited; it relates to quantum wells 9 which are 3 nm to 4 nm wide with a barrier height ΔE$_v$ in the order of 160 meV, for an aluminum content of 0.30 of the material AlGaAs. (Here and in the following the "content" is understood to be the mole fraction x$_{Al}$ of Al$_x$Ga$_{1-x}$As). In this case, the sub-band HH$_2$ is nearly at the edge of the well and the difference in energy between the edge of the well and the sub-band HH$_1$ is 144 meV for a well of 3 nm or 157 meV for a well of 4 nm (FIG. 5a).

Under illumination (FIG. 5b), the photons with corresponding energy (144 meV and 157 meV respectively) are absorbed (arrow 11), thus causing movement of the holes in the continuum of the valence band (arrow 12) when an electric field is applied.

Since it is known that the effective mass of holes in the continuum of the valence band of AlGaAs (and GaAs) is very high, in the order of 0.4 m$_o$ (m$_o$ being the mass of the electron), it will be understood that their mobility will be reduced and that their mean free path will be short, in other words, their lifetime will be very short.

This prior art structure has another problem in the presence of the sub-band LH$_1$ in the quantum wells 9. Thus this sub-band is populated with holes of low effective mass which are about 50 meV from the edge of the quantum well. Considering equation (1) above, the tunneling transparency of these light holes is thus high, the more so because the Fermi level approaches the level LH$_1$, i.e. the layer of GaAs is p-doped—which applies in this case with the doping lying between 10$^{17}$ cm$^{-3}$ and 5×10$^{18}$ cm$^{-3}$ approx. Once again an irreconcilable compromise is encountered between a large barrier width, necessary to reduce the dark current which would otherwise be very high, and a concomitant reduction of the photo-current and thus of the sensitivity of the detector.

The invention, which will now be described, specifically seeks to overcome this problem. Its teaching lies essentially in an appropriate choice of the composition of the AlGaAs alloy and of the thicknesses of the layers of GaAs and AlGaAs.

The invention in particular used the phenomenon of inter-sub-band transition between HH$_1$ and LH$_1$ in the first place to eliminate the parasitic tunnel effect due to the light LH$_1$ holes. In the second place, once this parasitic effect has been eliminated, it is possible to reduce the width of the AlGaAs barrier insofar as this is needed, because the holes populating the sub-level HH$_1$ are very heavy, exhibiting a low tunneling transparency and therefore only having a small effect on the performance of the detector.

If equation (1) is applied, this reduction of thickness can be by a factor at least equivalent to:

$$(m^*_{HH1}/m^*_{LH1})^{1/2} = 2.4 \text{ approx.}$$

and at most equivalent to $$(m^*_{HH1}/m^*_{LH1})^{1/2} (\Delta E_{HH1}/\Delta E_{LH1})^{3/2} = 12 \text{ approx.}$$

where m*$_{HH1}$ and m*$_{LH1}$ are taken to be 0.4 m$_o$ and 0.07 m$_o$ respectively (m$_o$ being the mass of the electron), and ΔE$_{HH1}$ and ΔE$_{LH1}$ are the heights of the respective barriers associated with the sub-bands HH$_1$ and LH$_1$, with ΔE$_{HH1}$ =190 meV approx. and ΔE$_{LH1}$=66 meV approx.

For the detector to operate at the selected wavelength of about 10 μm it is necessary that the energy between the two sub-bands LH$_1$ and HH$_1$ shall be in the order of 124 meV. It can be shown by quantum mechanics calculations that, in this case, the width of the hole should be in the order of 1.5 nm to 2.5 nm, this thickness depending on the height of the potential barrier, i.e. on the aluminum content in the AlGaAs. The calculations show that the height of the barrier should exceed about 230 meV, which requires an aluminum content greater than about 0.42.

A structure in accordance with the invention is illustrated schematically in FIG. 6a (at equilibrium) and FIG. 6b (under illumination and with an applied electric field).

The quantum well detector of the invention is thus formed from a succession of quantum wells 9 of very small width (around 1.5 nm to 2.5 nm), separated by potential barriers 10 which are themselves relatively thin.

It is known that the $LH_1$ holes, which have a low effective mass, can pass through thin barriers by the tunnel effect, even if the height of the barrier $\Delta E_v$ is above their energy level, and this the more easily when these levels present the same energy, thus creating the well-known "resonant tunnel effect". The holes populating the sub-band $LH_1$ thus come to move freely, perpendicular to the plane of the layers, in a periodic potential, sometimes also known as a "superlattice".

It is thus possible to be released from too precise a definition of the thickness of the AlGaAs by using barrier heights such that the sub-band $LH_1$ is located right at the edge of the quantum well, as shown in FIGS. 7a and 7b; in this case, the height $\Delta E_v$ of the barrier adjacent the quantum well is no longer greater than but just equal to the energy of the sub-band $LH_1$. This configuration is close to that shown in FIGS. 5a and 5b (corresponding to the proposal of Levine in the cited article) but with the essential difference of the presence, in the prior art situation, of the $LH_1$ sub-band located in the quantum well below the energy of the potential barrier, contributing thus to an increase in the dark current.

It is also known that although the sub-band $LH_1$ is quantized, it has its wave function completely spread over the whole structure, by the resonant tunnel effect, which leads to an increase $\delta E_{LH1}$ in the energy of the sub-band, as can be seen at 13 in FIGS. 6a and 6b. This increase $\delta E_{LH1}$ depends on the width of the well. For wells 2 nm wide, the increase is in the order of 50 meV, 15 meV and 5 meV for barriers 5 nm, 7.5 nm and 10 nm wide respectively (the height of the barrier also having an effect on these values).

As for the holes populating the sub-band $HH_1$, which do not only have a large effective mass but which are also located deep in the hole, these do not experience the tunnel effect and their wave function also remains localized.

In summary, the light holes $LH_1$ moving in the periodic potential have a lifetime longer than that of the heavy holes moving in the continuum of the valence band, as explained with reference to FIG. 5.

Moreover, although the movement of holes in the band $LH_1$ will be favored by a small barrier width (a small thickness of the AlGaAs layer), it is desirable not to reduce this value, because too large an increase in $\Delta E_{LH1}$ will result in a reduction in the energy difference between the sub-bands $HH_1$ and $LH_1$, so increasing the dark current.

Knowing however that infrared detectors operate at the temperature of liquid nitrogen, namely 77 K., and that the thermal energy is 6.6 meV at this temperature, it is only important that the increase $\Delta E_{LH1}$ shall be less than 6.6 meV. It is thus possible to find an optimum barrier width, defined in such a manner that $\Delta E_{LH1}$=6.6 meV approx. For wells 2 nm wide, this optimum corresponds to a thickness of AlGaAs of about 8 nm (a value which can vary with the aluminum content of the AlGaAs).

Taking into account the very low values of the width of the quantum wells which have been indicated, a variation of an atomic monolayer, i.e. in the order of 0.2 nm to 0.3 nm involves an relative variation in thickness of 10%. It is thus necessary to use techniques such as molecular beam expitaxy (MBE) or metal organic chemical vapor deposition (MOCVD) which are compatible with such precision and ensure good uniformity of the epitaxy over the whole surface of the semiconductor chip.

Moreover, the invention is not limited to a GaAs/AlGaAs heterojunction and its teaching can apply equally to other heterostructures formed on the basis of III-V alloys.

In particular the alloy InGaAs can be used in place of GaAs to realize the quantum wells. In particular, this alloy InGaAs having a lattice constant greater than that of GaAs, it will be subjected to a uniaxial strain which will have the effect of pushing the sub-band $LH_1$ further away in energy, in other words of increasing the energy difference between the sub-bands $HH_1$ and $LH_1$. It is possible, for the same performance, to enlarge the quantum well by this phenomenon, relative to a similar structure using GaAs, and thus to facilitate practical implementation by virtue of a greater thickness of the layer to be deposited.

This effect is particularly marked: thus, for an indium content (i.e. a mole fraction $Y_{In}$ of $In_yGa_{1-y}As$) of only 0.03, thus for a composition very close to that of GaAs, the increase in the energy is in the order of 15 meV. It is however noted that alloys with an indium content greater than 0.05 cannot really be used, because the excessive strain then risks creation of interfacial dislocations, given the total thickness of the quantum well structure.

I claim:

1. A semiconductor component of quantum well infrared detector type comprising a succession of alternating stacked layers of III-V semiconductor material with a large forbidden band and a III-V semiconductor material with a small forbidden band with p-doping, defining an assembly of potential barriers alternating in series with quantum wells, each well including sub-bands of HH and LH type in the region of the layer comprising the material with the small forbidden band in the valance diagram ($E_v$) of each corresponding heterostructure, characterized in that:

the thickness of the layers of the material with a small forbidden band is selected such that only two quantum sub-levels $LH_1$ and $HH_1$ appear in each well, and in that the energy difference between the two sub-levels corresponds to the energy of photons to be detected, and the material with the large forbidden band comprises a composition that causes the height ($\Delta E_v$) of the potential barriers to be equal to or greater than the energy of the $LH_1$ sub-band.

2. The component of claim 2 wherein, for resonant-tunnel-effect light holes populate the sub-level $LH_1$ and resonant-tunnel-effect heavy holes populate the $HH_1$ sub-level, the thickness of the layers of the material with a large forbidden band is so selected that the height of the potential barriers defined by the layers of said material creates for the light holes a state in which light-hole wave function is spread over the assembly, while heavy-hole wave function is localized.

3. The component of claim 1 wherein the material with a large forbidden band is $Al_xGa_{1-x}As$.

4. The component of claim 3 wherein the material with a small forbidden band is GaAs.

5. The component of claim 4 wherein the thickness of the layer of the material with a small forbidden band lies approximately between 1.5 nm and 2.5 nm.

6. The component of claim 4 wherein the thickness of the layers of the material with a large forbidden band is approximately 8 nm.

7. The component of claim 3 wherein the material with a small forbidden band is $In_yGa_{1-y}As$ with an indium content of approximately $Y_{In} \leq 0.05$.

\* \* \* \* \*